(12) United States Patent
Kumar et al.

(10) Patent No.: US 8,487,691 B1
(45) Date of Patent: Jul. 16, 2013

(54) AC NOISE SUPPRESSION FROM A BIAS SIGNAL IN HIGH VOLTAGE SUPPLY/LOW VOLTAGE DEVICE

(75) Inventors: Pankaj Kumar, Bangalore (IN); Pramod Parameswaran, Bangalore (IN); Vani Deshpande, Bangalore (IN); Makeshwar Kothandaraman, Bangalore (IN)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/494,282

(22) Filed: Jun. 12, 2012

(51) Int. Cl.
*G05F 1/10* (2006.01)

(52) U.S. Cl.
USPC ............ 327/538; 327/530; 327/531; 327/551

(58) Field of Classification Search
USPC ................. 327/530, 531, 532, 538, 543, 545, 327/546, 547, 551, 560
See application file for complete search history.

(56) References Cited

U.S. PATENT DOCUMENTS

| | | | | |
|---|---|---|---|---|
| 5,886,568 A * | 3/1999 | Ngo et al. | | 327/538 |
| 5,942,934 A * | 8/1999 | Ngo et al. | | 327/540 |
| 6,388,495 B1 * | 5/2002 | Roy et al. | | 327/309 |
| 6,684,065 B2 | 1/2004 | Bult et al. | | 455/252.1 |
| 7,193,453 B2 * | 3/2007 | Wei et al. | | 327/538 |
| 7,466,186 B2 * | 12/2008 | Sumita | | 327/534 |
| 7,944,306 B2 | 5/2011 | Prikhodko et al. | | 330/285 |
| 7,948,330 B2 | 5/2011 | Seo et al. | | 331/186 |
| 2003/0030497 A1 | 2/2003 | Duncan et al. | | 331/34 |
| 2008/0252364 A1 * | 10/2008 | Chou | | 327/543 |
| 2010/0013560 A1 * | 1/2010 | Rao et al. | | 330/296 |
| 2013/0043935 A1 * | 2/2013 | Crisp et al. | | 327/538 |

* cited by examiner

*Primary Examiner* — Lincoln Donovan
*Assistant Examiner* — Jung H Kim
(74) *Attorney, Agent, or Firm* — Christopher P. Maiorana, PC

(57) ABSTRACT

An apparatus comprising a first circuit, a second circuit, and a third circuit. The first circuit may be configured to generate a first control voltage and a second control voltage. The second circuit may be configured to generate a bias signal in response to the first control voltage and the second control voltage. The third circuit may be configured to generate a filtered signal in response to the bias signal. The filtered signal may be added to the first control voltage and the second control voltage to provide AC noise suppression when generating the bias signal.

13 Claims, 4 Drawing Sheets

US 8,487,691 B1

AC NOISE SUPPRESSION FROM A BIAS SIGNAL IN HIGH VOLTAGE SUPPLY/LOW VOLTAGE DEVICE

FIELD OF THE INVENTION

The present invention relates to noise suppression circuits generally and, more particularly, to a method and/or apparatus for implementing an AC noise suppression circuit from a bias signal in a high voltage supply/low voltage device.

BACKGROUND OF THE INVENTION

Conventional circuits for generating BIAS voltages have been used as intermediate voltages in high voltage 10 designs using low voltage devices. The BIAS voltages have been used as a source to control inverter stages in pre-driver circuits. Conventional designs also use BIAS voltages as a gate input to drive devices which interact with an input/output PAD. Such designs often have large capacitive currents and source/sink current, which contributes the AC noise. Decoupling capacitors have been used to discharge this AC noise. Such capacitors consume a large amount of chip area and expand the overall cell area.

It would be desirable to implement a circuit and/or method to provide AC noise suppression when generating a bias signal using high voltage supply/low voltage devices.

SUMMARY OF THE INVENTION

The present invention concerns an apparatus comprising a first circuit, a second circuit, and a third circuit. The first circuit may be configured to generate a first control voltage and a second control voltage. The second circuit may be configured to generate a bias signal in response to the first control voltage and the second control voltage. The third circuit may be configured to generate a filtered signal in response to the bias signal. The filtered signal may be added to the first control voltage and the second control voltage to provide AC noise suppression when generating the bias signal.

The objects, features and advantages of the present invention include providing a noise suppression circuit that may (i) provide AC noise suppression, (ii) be implemented in a high supply/low voltage device, (iii) reduce chip area and/or (iv) be implemented on an Integrated Circuit (IC).

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
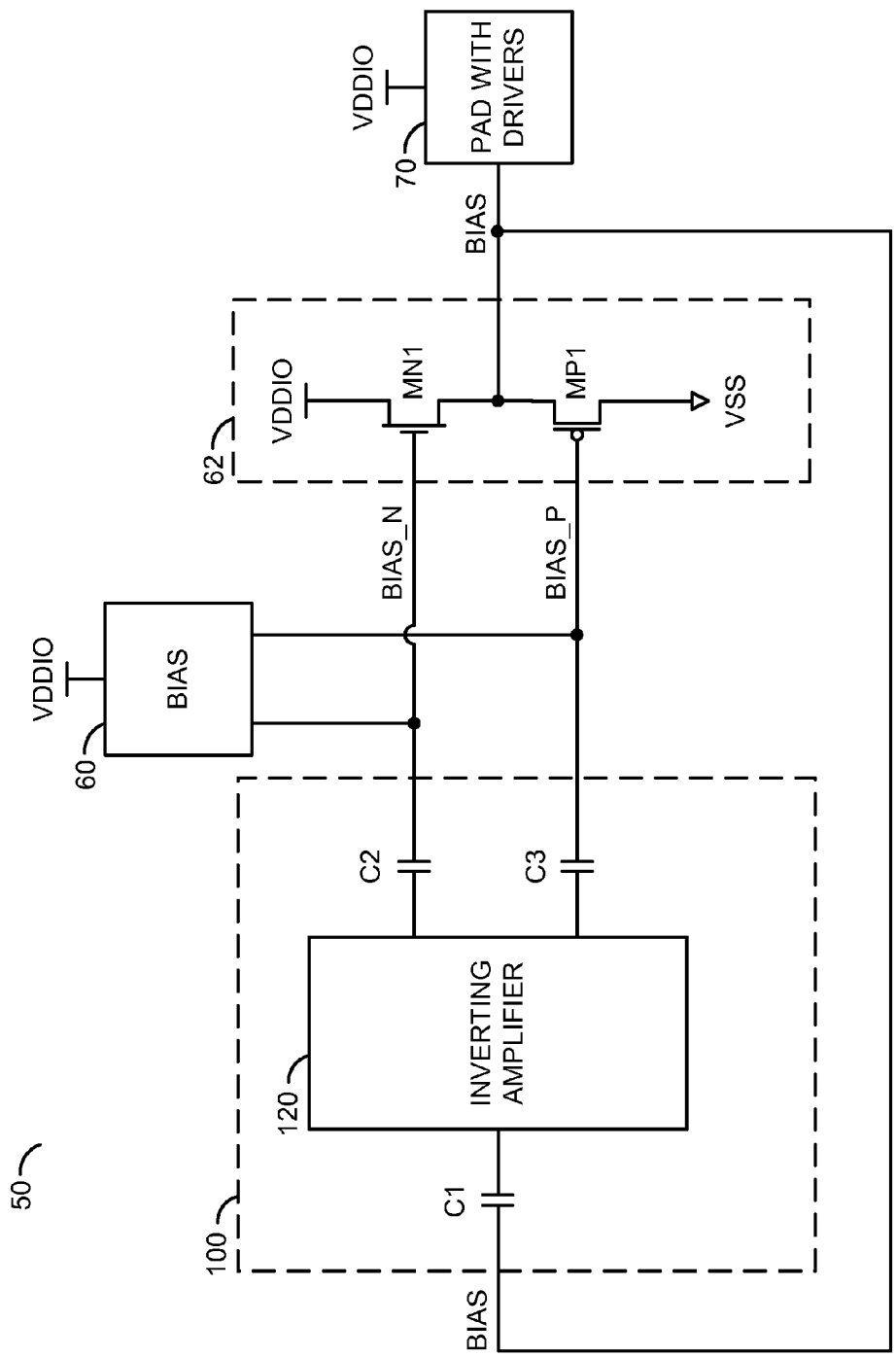
FIG. 1 is a diagram of the invention.

Referring to FIG. 1, a block diagram of a circuit 100 is shown in accordance with an embodiment of the present invention. The circuit is shown in the context of a circuit 50. The circuit 50 generally comprises the circuit 100, a block (or circuit) 60, a block (or circuit) 62 and a block (or circuit) 70.

The circuit 60 may be implemented as a bias circuit. The circuit 62 may be implemented as a voltage divider circuit. The circuit 70 may be implemented as a pad circuit. The pad circuit 70 may be one of a plurality of input/output pads connected between a core of an integrated circuit (IC) and a number of lead frames (not shown). A number of the circuits 100 may be implemented between a number of pads and the core of the integrated circuit.

The circuit 62 may be implemented as a transistor MN1 and a transistor MP1. The circuit 100 may be used to generate a voltage (e.g., BIAS). The circuit 100 generally comprises a block (or circuit) 120, a device C1, a device C2 and a device C3. The circuit 120 may be implemented as an inverting amplifier circuit. The device C1 may be implemented as a capacitor. The device C2 may also be implemented as a capacitor. The device C3 may also be implemented as a capacitor. The transistors MN1 and MP1 may have gates connected to BIAS_N and BIAS_P, respectively. A connection between the drain of the transistor MN1 and the source of the transistor MP1 may be connected to generate the signal BIAS. The signal BIAS_N may be designed to have a voltage BIAS+VT (where VT is a transistor threshold voltage). The signal BIAS_P may be designed to have a voltage BIAS−VT.

AC (alternating current) noise on the signal BIAS is generally passed to inverting amplifier circuit 120 through the capacitor C1. The inverting amplifier circuit 120 may amplify and/or invert the AC noise. The inverting amplifier 120 may be coupled to gates of the transistor MN1 and the transistor MP1 through the capacitor C2 and the capacitor C3, respectively. The signal BIAS_N and the signal BIAS_P will normally shift AC noise on the signal BIAS in opposite directions. Shifting the noise through the inverting amplifier 120 may help to effectively suppress noise.

Figure 2:
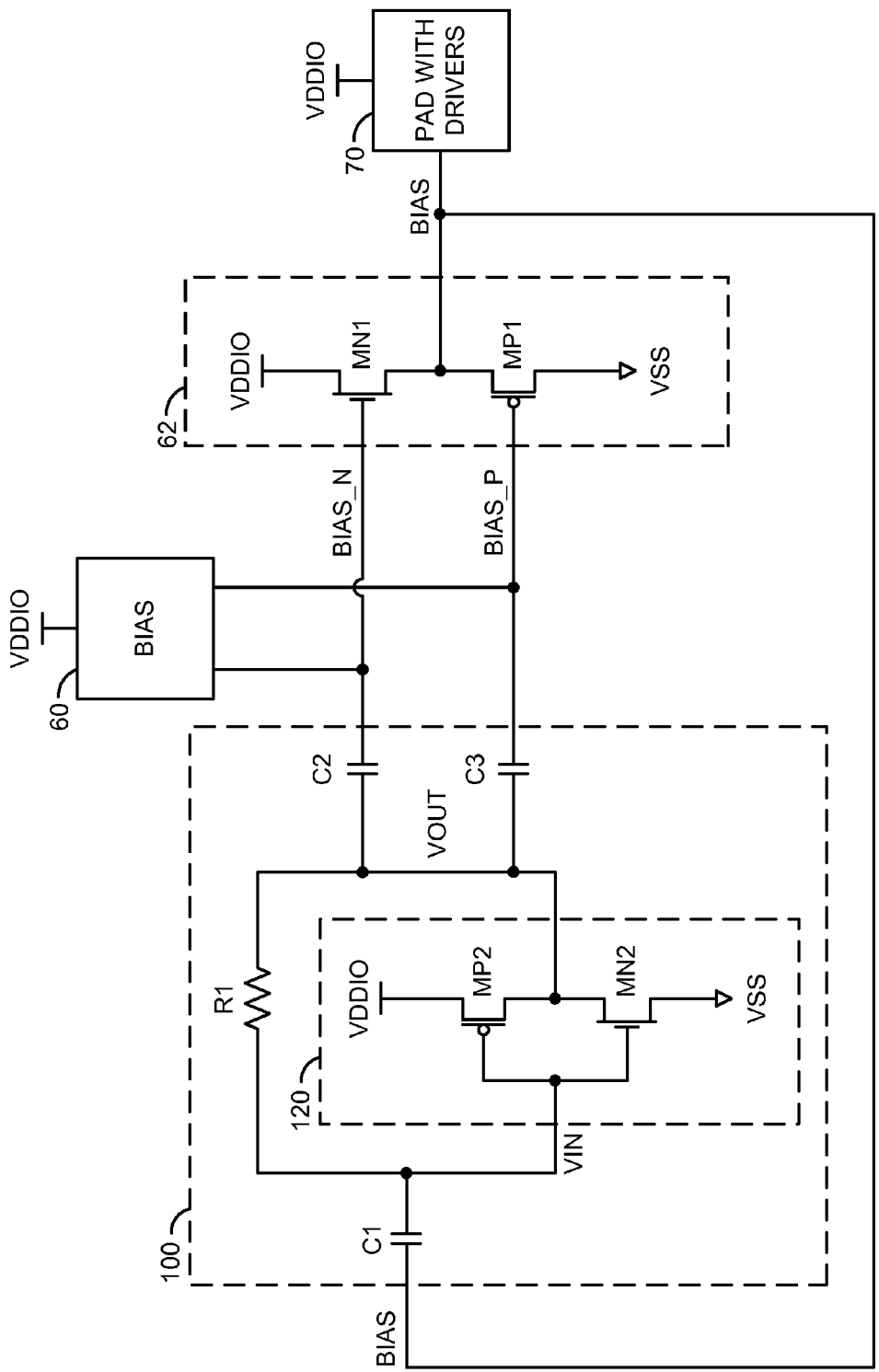
FIG. 2 is a more detailed diagram of the invention.

Referring to FIG. 2, a more detailed diagram of the circuit 50 is shown. The circuit 100 generally comprises the circuit 120, a resistor R1, the capacitor C1, the capacitor C2, and the capacitor C3. The circuit 120 generally comprises a transistor MP2 and a transistor MN2. The signal BIAS may be presented to the capacitor C1. The capacitor C1 may be used to filter an AC component from the signal BIAS to generate a signal (e.g., VIN). The signal VIN may be presented to the resistor R1, and to a gate of the transistor MP2 and a gate of the transistor MN2. A common connection between a drain of the transistor MP2 and a source of the transistor MN2 may be connected to a resistor R1, the capacitor C2, and the capacitor C3 to generate a signal (e.g., VOUT). The transistor MN1 may have a source connected to a power supply (e.g., VDDIO). The transistor MP1 may have a drain connected to VSS. A gate voltage of the transistor MN1 may be generated as BIAS+VT (e.g., the signal BIAS_N). A gate voltage of the transistor MP1 may be generated as BIAS−VT (e.g., the signal BIAS_P). The circuit C2 normally generates the signal BIAS. The signal BIAS_N and the signal BIAS_P are normally generated to be reliable (or consistent) over process voltage and temperature (PVT) variations.

The transistors MP2 and MN2 may form the inverting amplifier 120. The amplifier 120 may be DC biased by the resistor R1. The input signal VIN and the output signal VOUT may be biased to be at the same DC voltage level. The AC noise on the signal BIAS is generally coupled to the amplifier 120 through the capacitor C1. The amplifier 120 will normally amplify the noise on the input signal VIN and provide an amplified inverted output as the signal VOUT. The signal VOUT is generally coupled to the gate of the transistor MN1 and the gate of the transistor MP1 through the capacitor C2 and the capacitor C3, respectively. Since the signal VOUT is inverted compared to the signal BIAS, the transistor MN1 and the transistor MP1 will normally compensate for AC noise and will restore the DC value of the signal BIAS.

Figure 3:
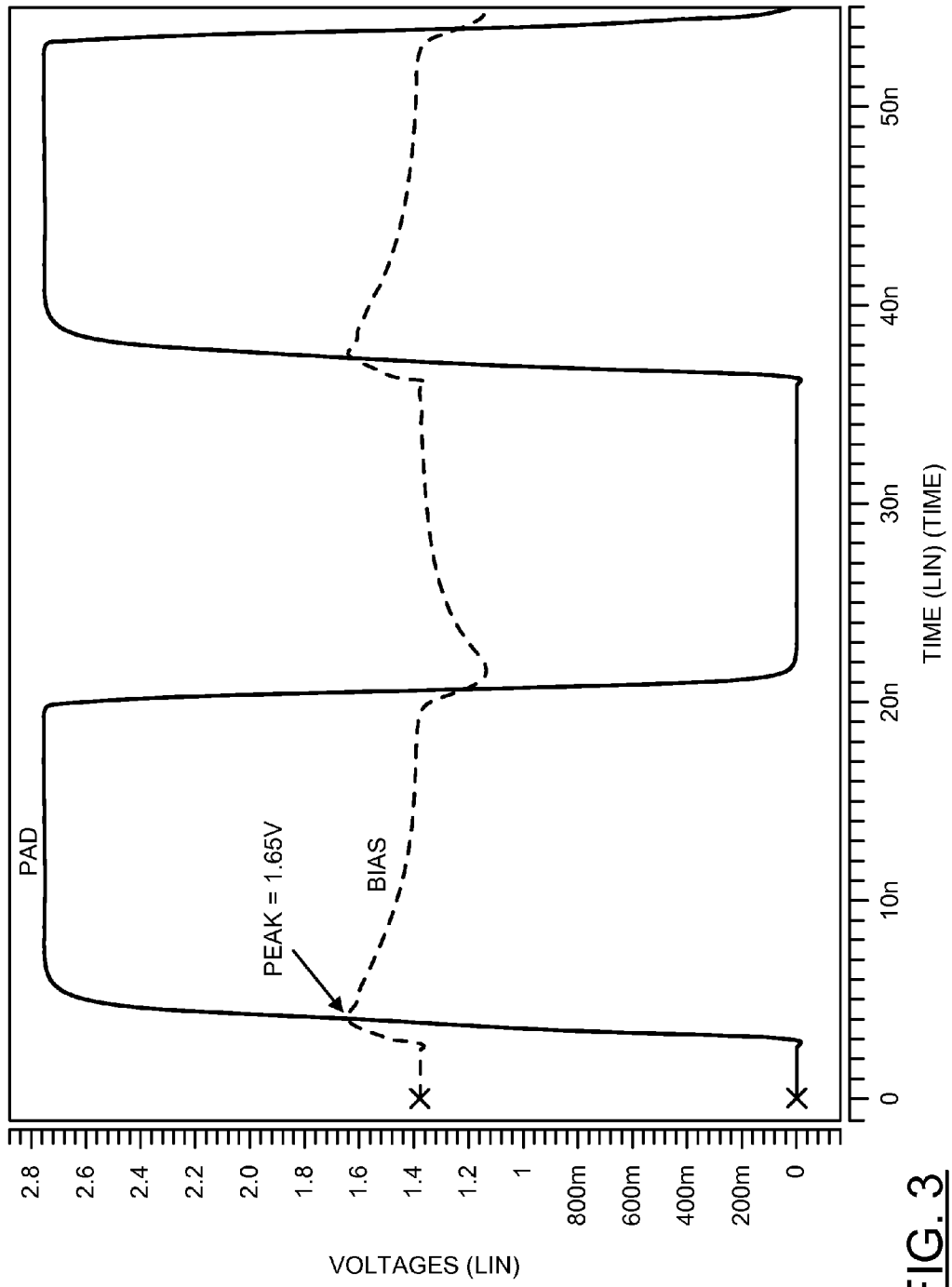
FIG. 3 is a plot of the peak noise of the bias voltage versus the pad voltage without the circuit 100.

Referring to FIG. 3, a plot showing peak noise on the signal BIAS without the circuit 100 is shown. Generally, noise is associated with the signal PAD and moves in the direction of the signal PAD.

Figure 4:
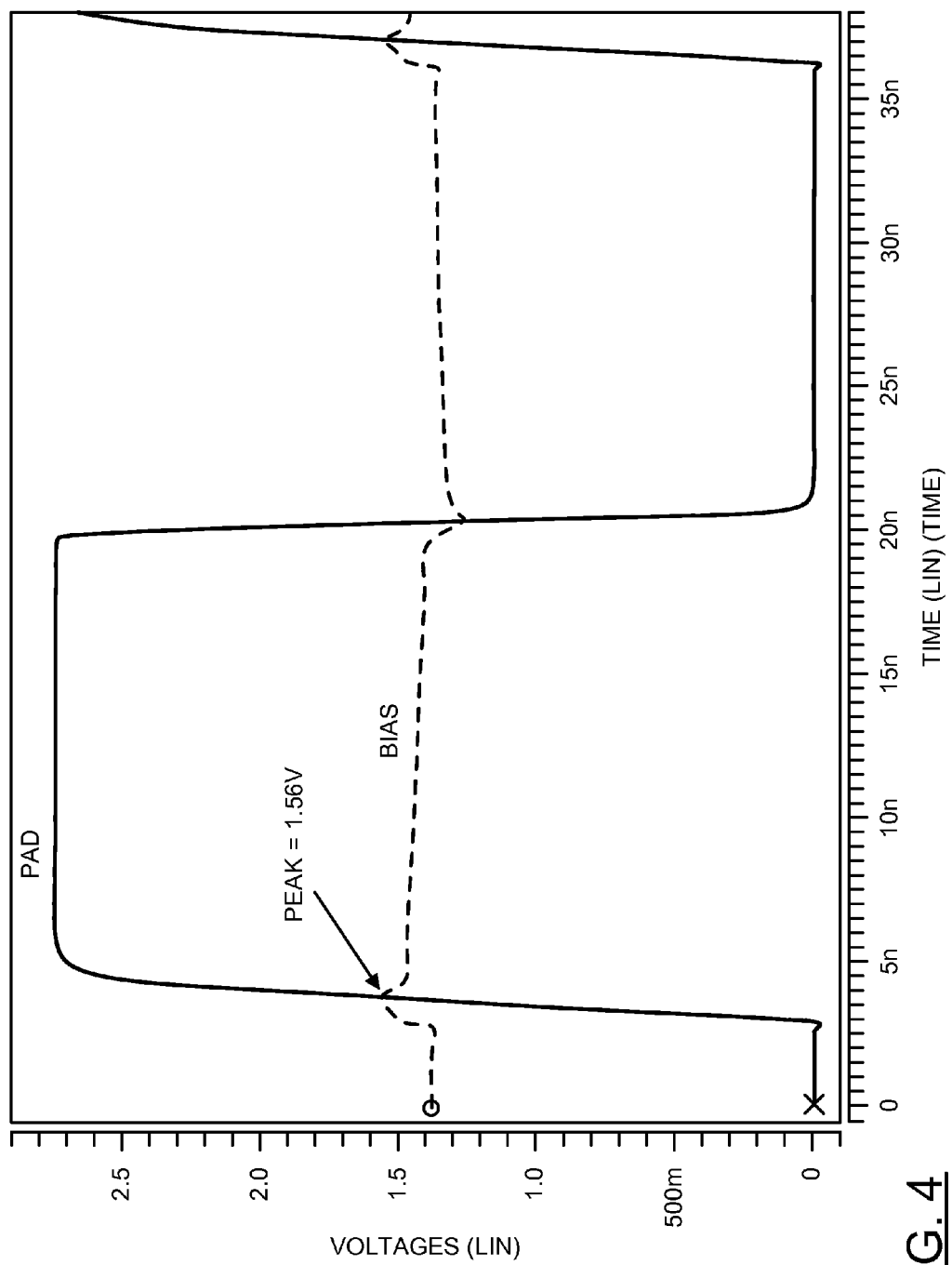
FIG. 4 is a plot of the peak noise of the bias voltage versus the pad voltage with the circuit 100.

Referring to FIG. 4, reduction in peak on the signal BIAS when the circuit 100 is implemented. As shown, the circuit 100 saves at lease 90 mV of peak noise. In general, as the amplification strength of amplifier 100 increases, more peak noise is generally reduced. Additional amplification strength may increase the overall power used by the circuit 100. The circuit 100 may be designed to balance noise reduction with power consumption.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products), one or more integrated circuits, one or more chips or die arranged as flip-chip modules and/or multi-chip modules or by interconnecting an appropriate network of conventional component circuits, as is described herein, modifications of which will be readily apparent to those skilled in the art(s).

While the invention has been particularly shown and described with reference to the preferred embodiments thereof, it will be understood by those skilled in the art that various changes in form and details may be made without departing from the scope of the invention.

The invention claimed is:

1. An apparatus comprising:
    a first circuit configured to generate a first control voltage and a second control voltage;
    a second circuit configured to generate a bias signal in response to said first control voltage and said second control voltage; and
    a third circuit configured to generate a filtered signal in response to said bias signal, wherein said filtered signal is added to said first control voltage and said second control voltage to provide alternating current (AC) noise suppression when generating said bias signal.

2. The apparatus according to claim 1, wherein said first circuit comprises a bias circuit, said second circuit comprises a voltage divider circuit and said third circuit comprises an inverting amplifier circuit.

3. The apparatus according to claim 1, wherein said apparatus is implemented as part of an integrated circuit (IC).

4. The apparatus according to claim 1, wherein said first control voltage and said second control voltage comprise direct current (DC) control voltages.

5. The apparatus according to claim 1, wherein said third circuit provides filtering of AC noise from said bias signal.

6. The apparatus according to claim 1, wherein said third circuit comprises an inverting amplifier circuit, a resistor, and a plurality of capacitors.

7. The apparatus according to claim 6, wherein said inverting amplifier circuit is implemented using low voltage devices operating with a high voltage supply.

8. The apparatus according to claim 1, wherein said apparatus is implemented as one or more integrated circuits (ICs).

9. An apparatus comprising:
    means for generating a first control voltage and a second control voltage;
    means for generating a bias signal in response to said first control voltage and said second control voltage; and
    means for generating a filtered signal in response to said bias signal, wherein said filtered signal is added to said first control voltage and said second control voltage to provide alternating current (AC) noise suppression when generating said bias signal.

10. A method for generating a bias signal, comprising the steps of:
    generating a first control voltage and a second control voltage;
    generating a bias signal in response to said first control voltage and said second control voltage; and
    generating a filtered signal in response to said bias signal, wherein said filtered signal is added to said first control voltage and said second control voltage to provide alternating current (AC) noise suppression when generating said bias signal.

11. The method according to claim 10, wherein said first control voltage and said second control voltage comprise direct current (DC) control voltages.

12. The method according to claim 10, wherein said method provides filtering of AC noise from said bias signal.

13. The method according to claim 10, wherein method is implemented using low voltage devices operating with a high voltage supply.

* * * * *